(12) United States Patent
Stegemann

(10) Patent No.: US 8,962,469 B2
(45) Date of Patent: Feb. 24, 2015

(54) METHODS OF STRIPPING RESIST AFTER METAL DEPOSITION

(75) Inventor: Maik Stegemann, Pesterwitz (DE)

(73) Assignee: Infineon Technologies AG, Neubiberg (DE)

( * ) Notice: Subject to any disclaimer, the term of this patent is extended or adjusted under 35 U.S.C. 154(b) by 190 days.

(21) Appl. No.: 13/398,411

(22) Filed: Feb. 16, 2012

(65) Prior Publication Data

US 2013/0217223 A1 Aug. 22, 2013

(51) Int. Cl.
*H01L 21/44* (2006.01)

(52) U.S. Cl.
USPC .......................................................... 438/612

(58) Field of Classification Search
None
See application file for complete search history.

(56) References Cited

U.S. PATENT DOCUMENTS

| | | | |
|---|---|---|---|
| 5,403,436 A | 4/1995 | Fujimura et al. | |
| 5,783,459 A | 7/1998 | Suzuki et al. | |
| 5,961,775 A | 10/1999 | Fujimura et al. | |
| 5,998,104 A | 12/1999 | Fujimura et al. | |
| 6,232,237 B1 | 5/2001 | Tamaoka et al. | |
| 6,352,938 B2 | 3/2002 | Chen et al. | |
| 6,492,257 B1 | 12/2002 | Shields et al. | |
| 6,560,864 B1* | 5/2003 | Chang et al. | 29/846 |
| 7,629,249 B2* | 12/2009 | Borthakur | 438/637 |
| 7,807,579 B2 | 10/2010 | Yang et al. | |
| 2001/0041453 A1 | 11/2001 | Ohuchi | |
| 2004/0256351 A1 | 12/2004 | Chung et al. | |
| 2005/0085066 A1 | 4/2005 | Tsao et al. | |
| 2006/0178007 A1 | 8/2006 | Nakamura et al. | |
| 2006/0281308 A1 | 12/2006 | Aggarwal et al. | |
| 2006/0281312 A1* | 12/2006 | Smith et al. | 438/689 |
| 2008/0157378 A1 | 7/2008 | Lee | |
| 2009/0181164 A1 | 7/2009 | Wang et al. | |
| 2011/0120650 A1 | 5/2011 | Asako et al. | |

* cited by examiner

*Primary Examiner* — Scott B Geyer
(74) *Attorney, Agent, or Firm* — Slater & Matsil, L.L.P.

(57) ABSTRACT

In accordance with an embodiment of the present invention, a method of forming a semiconductor device includes forming a seed layer over a dielectric layer and a patterned resist layer over the seed layer. Next, metal lines are formed on regions of the seed layer not covered by the patterned resist layer. The patterned resist layer is removed using a plasma process, which involves using an oxidizing species and a reducing species in the plasma. The reducing species substantially prevents the oxidation of the metal lines and the seed layer during the plasma process.

45 Claims, 11 Drawing Sheets

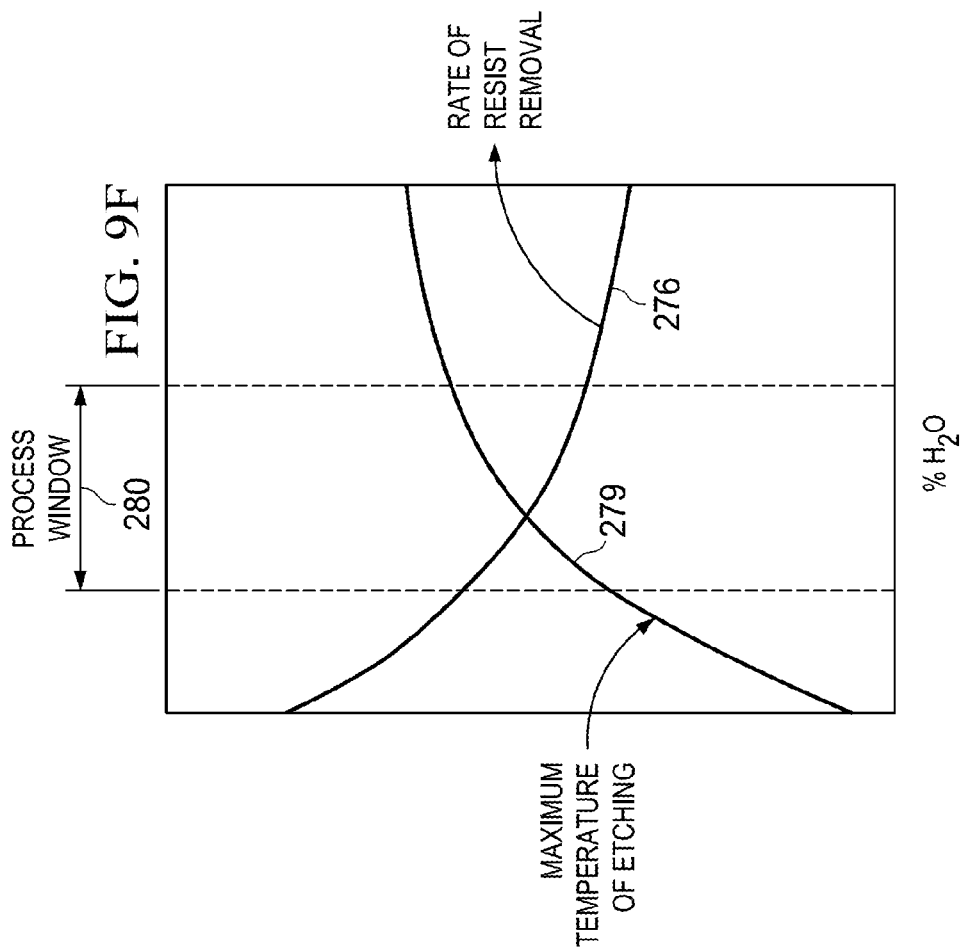
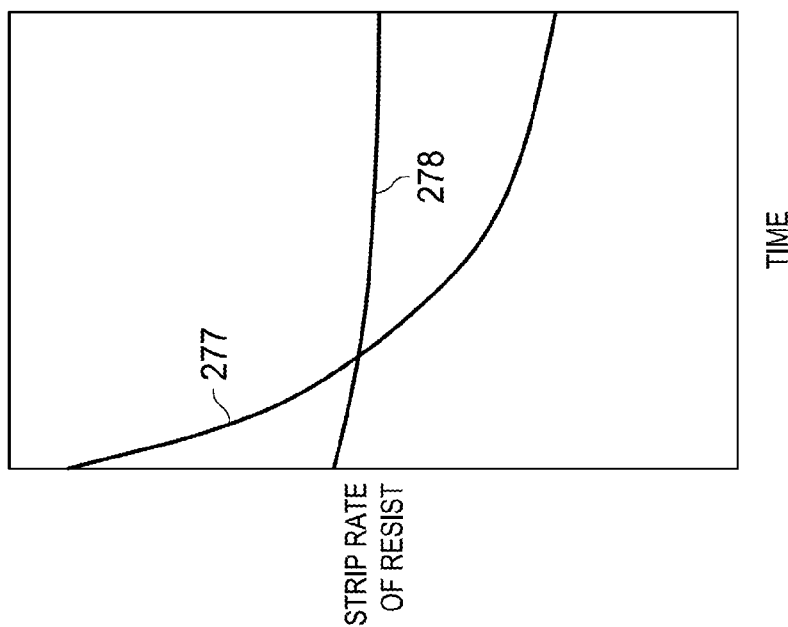

METHODS OF STRIPPING RESIST AFTER METAL DEPOSITION

TECHNICAL FIELD

The present invention relates generally to metal deposition and more particularly to methods of stripping resist after metal deposition.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

After fabricating various devices within a semiconductor substrate, these devices are interconnected through metal interconnects. Metal interconnects are formed over the device regions and are formed in multiple layers or levels called metallization levels. Metal interconnects were made of aluminum in traditional processes. Technology scaling has required aggressively reducing the thicknesses of the metal interconnects in the lower metallization levels. The reduced thicknesses resulted in increased resistances of these metal lines. As a consequence, lower levels of metallization have been replaced by copper, which has a lower resistance. However, the uppermost level of metallization in conventional devices is made of aluminum. This is due to the complexity of integrating copper into the uppermost metallization level, which requires thick metal lines.

SUMMARY OF THE INVENTION

These and other problems are generally solved or circumvented, and technical advantages are generally achieved, by illustrative embodiments of the present invention.

In accordance with an embodiment of the present invention, a method of forming a semiconductor device includes forming a seed layer over a dielectric layer and a patterned resist layer over the seedlayer. Next, metal lines are formed on regions of the seed layer not covered by the patterned resist layer. The patterned resist layer is removed using a plasma process, which comprises an oxidizing species and a reducing species. The reducing species substantially prevents the oxidation of the metal lines and the seed layer during the plasma process.

In accordance with an embodiment of the present invention, a method of forming a semiconductor device comprises forming a seed layer over a dielectric layer and a patterned resist layer over the seed layer. Metal lines are formed between the patterned resist layer. The first portion of the patterned resist layer is removed using a plasma process in a first stage of the plasma process. The plasma process includes an oxidizing species and a reducing species during the first stage. Metal oxide particles and/or metal oxide film formed over the metal lines in the first stage are removed during a second stage of the plasma process. The plasma chemistry during the second stage is more reducing than the plasma chemistry during the first stage. A second portion of the patterned resist layer is removed using the plasma process in a third stage of the plasma process. The plasma process includes the oxidizing species and the reducing species during the third stage.

In accordance with an embodiment of the present invention, a method of forming a semiconductor device comprises forming a metal seed layer over a dielectric layer and a patterned resist layer over the seed layer. Using an electrochemical deposition process, metal lines are formed on regions of the seed layer between the patterned resist layer. The patterned resist layer is etched using a plasma process comprising oxygen and water vapor. The water vapor prevents the oxidation of the metal lines and the metal seed layer by the oxygen during the plasma process. The flow rate of the water vapor into the plasma chamber is at least two times a flow rate of the oxygen into the plasma chamber.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes

FIG. 9, which includes FIGS. 9A-9F, illustrates the plasma etch chemistry for stripping photo resist layers without damaging copper lines in accordance with embodiments of the invention.

Corresponding numerals and symbols in the different figures generally refer to corresponding parts unless otherwise

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely stripping of a patterned photo resist layer after copper electrochemical deposition. The invention may also be applied, however, to other instances when thick layers of resist or other materials have to be removed without harming adjacent structures. Similarly, embodiments of the invention may be applied to other processes such as wafer level processes for forming redistribution lines, which connect adjacent circuitry in a system on chip device.

In conventional devices, the uppermost metal lines are made of aluminum due to the complexity of integrating copper. This complexity arises due to the thick metal lines needed for the uppermost metal lines have to be fabricated with thick metal lines, for example, greater than about 5 μm. This requires long times for the copper deposition and subsequent stripping of the photo resist layers. In particular, forming thick copper lines requires the deposition of thicker resist layer because the resist layer has to be thicker than the copper lines. Subsequently, after forming the copper lines, these thick photo resist layers have to be stripped residual free without damaging the adjacent exposed copper lines and seed layer. Embodiments of the present invention overcome problems associated with the stripping of thick photo resist layers.

An embodiment of the invention for stripping photo resist layers after copper deposition will be described using FIGS. 1-6. An alternative embodiment of the invention for stripping photo resist layers after copper deposition will be described using FIGS. 7-8. The process conditions for stripping photo resist layers without damaging copper lines and seed layers will be described using FIG. 9.

Figure 1A:
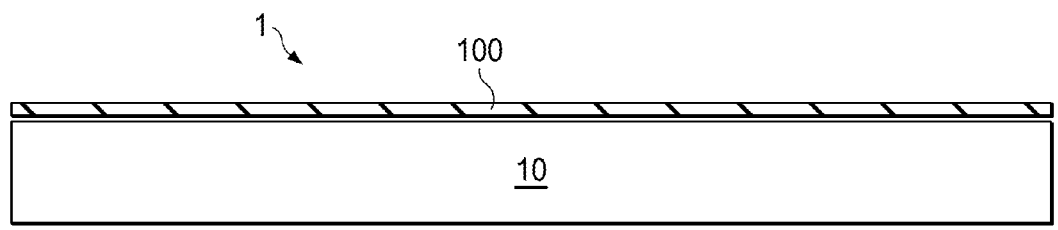
FIGS. 1A and 1B, illustrates a cross-sectional view of a semiconductor device after formation of the device regions and most of the metallization levels in accordance with an embodiment of the invention.
Figure 1B:
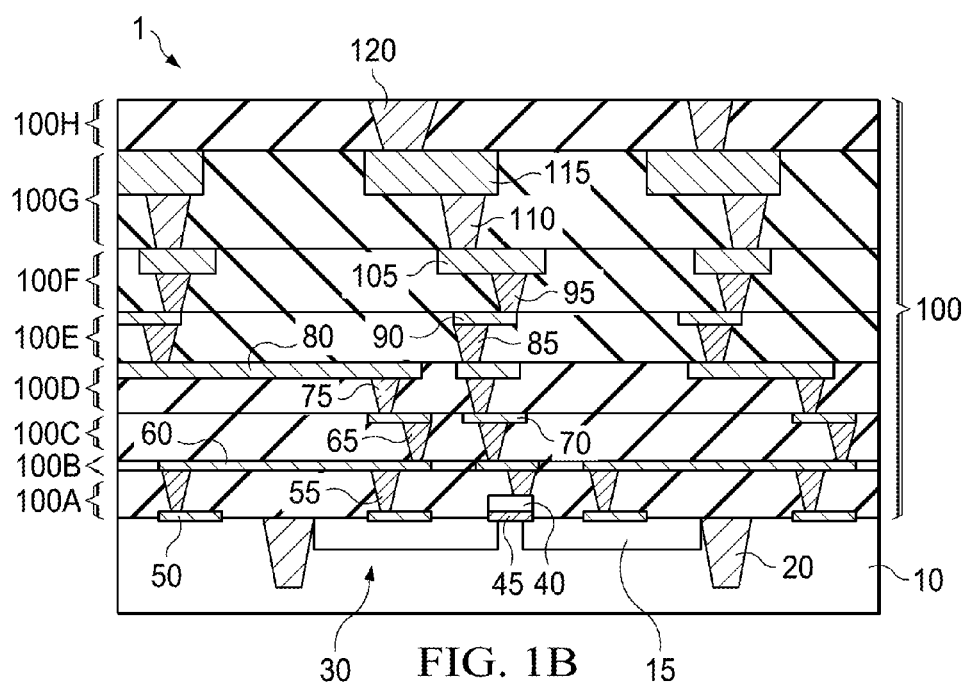

FIG. 1, which includes FIGS. 1A and 1B, illustrates a cross-sectional view of a chip after formation of the device regions and most of the metallization levels in accordance with an embodiment of the invention.

FIG. 1 illustrates a top cross sectional view of the chip 1, the chip 1 (not shown to scale) contains active circuitry disposed inside it. The active circuitry contains the device regions and includes necessary transistors, resistors, capacitors, inductors or other components used to form integrated circuits.

Next, metallization layers 100 are formed over the device regions to electrically contact and interconnect the active devices. The metallization layers 100 and device regions together form a complete functional integrated circuit. In other words, the electrical functions of the chip 1 can be performed by the interconnected active circuitry. In logic devices, the metallization may include many layers, e.g., nine or more, of copper or alternatively of other metals. In memory devices, such as DRAMs, the number of metal levels may be less.

A magnified cross-sectional portion of the chip 1 is illustrated in FIG. 1B. The semiconductor device is illustrated after the formation of device regions such as transistors regions within the substrate 10. The device regions may include any type of device including active devices such as transistors, diodes, thyristors, etc. as well as passive devices such as resistors, inductors, capacitors etc.

Next, the metallization layers 100 are formed. As an example, six metal levels comprising $M_1$, $M_2$, $M_3$, $M_4$, $M_5$, and $M_6$ are stacked vertically and connected by contact and via levels $V_1$, $V_2$, $V_3$, $V_4$, $V_5$, $V_6$, and $V_7$. In other embodiments, more or less number of metal levels and via levels may be used.

The metal lines and the vias are formed within an insulating layer 100. The insulating layer 100 comprises $SiO_2$ such as tetra ethyl oxysilane (TEOS) or fluorinated TEOS (FTEOS) in one or more embodiments. In various embodiments, the insulating layer 100 may comprise insulating materials typically used in semiconductor manufacturing for inter-level dielectric (ILD) layers such as doped glass (BPSG, PSG, BSG), organo silicate glass (OSG), carbon doped oxides (CDO), fluorinated silicate glass (FSG), spin-on glass (SOG), or low-k insulating materials, e.g., having a dielectric constant of about 4 or less. The insulating layer 100 may also comprise dense SiCOH or a porous dielectric having a k value of about 3 or lower, as examples.

In various embodiments, the insulating layer 100 may comprise a plurality of layers. In one embodiment, each subsequent layer of metal line is formed within another insulating layer. As a further example, the insulating layer 100 comprises a first insulating layer 100A, a second insulating layer 100B, a third insulating layer 100C, a fourth insulating layer 100D, a fifth insulating layer 100E, a sixth insulating layer 100F, a seventh insulating 100G, and an eighth insulating 100H. Each of these layers of the insulating layer 100 may comprise a thickness of about 100 nm to about 500 nm, for example, although alternatively, they may comprise other dimensions.

The substrate 10 may include many devices such as a transistor 5 illustrated in FIG. 1B. The transistor 5 comprises a gate 40, a gate dielectric 45, and a channel region 30 disposed between source/drain regions 15. Adjacent devices may be isolated using isolation regions 20. Active areas that include transistors (e.g., CMOS transistors) may be separated from one another by isolation regions 20, e.g., shallow trench isolation. In various embodiments, the active areas may also include other structures such as trenches, for example, forming trench capacitors, as well as diodes, thyristors, capacitors etc. The source/drain regions 15 (and other device regions) are coupled to other devices on the substrate 10 and to input/output contacts through contact regions 50. The contact regions 50 may be disposed within the substrate 10 and may extend above the substrate 10 (as illustrated). In one or more embodiments, the contact regions 50 comprise silicide regions. The first insulating layer 100A covers the contact regions 50 and surrounds the gate 40. The transistor 5 may comprise additional structures such as spacer around the gate 40 and the gate dielectric 45. Contact plugs 55 are disposed within the first insulating layer 100A to couple with device regions in the substrate 10 through the contact regions 50.

A second insulating layer 100B is formed over the first insulating layer 100A. A etch stop liner and dielectric diffusion barriers may be formed before depositing the second insulating layer 100B over the first insulating layer 100A. Such layers may be used to cap the metal lines and may comprise dielectric materials such as silicon nitride (SiN), silicon carbide (SiC), silicon carbo nitrides (SiCN) or other suitable dielectric barrier layers or combinations thereof. First metal lines 60 are formed within the second insulating layer 100B.

Further, metal layers are fabricated in various embodiments. The number of metal layers depends on the type of circuit and semiconductor device being fabricated. Only as an illustration seven metal layers are fabricated in this embodiment. A third insulating layer 100C is formed over the second insulating layer 100B. First vias 65 are formed within the third insulating layer 100C. Second metal lines 70 are formed within the third insulating layer 100C. A fourth insulating layer 100D is formed over the third insulating layer 100C. Second vias 75 and third metal lines 80 are formed within the fourth insulating layer 100D. A fifth insulating layer 100E is formed over the fourth insulating layer 100D. Third vias 85 and fourth metal lines 90 are formed within the fifth insulating layer 100E. A sixth insulating layer 100F is formed over the fifth insulating layer 100E. Fourth vias 95 and fifth metal lines 105 are formed within the sixth insulating layer 100F. A seventh insulating layer 100G is formed over the sixth insulating layer 100F. Fifth vias 110 and sixth metal lines 115 are formed within the seventh insulating layer 100G. An eighth insulating layer 100H is formed over the seventh insulating layer 100G. Sixth vias 120 are formed within the eighth insulating layer 100H. As illustrated, in one or more embodiments, the thickness of the metal lines and the vias increases moving up to the higher metallization layers.

Together, the metal lines and vias within the first insulating layer 100A, the second insulating layer 100B, the third insulating layer 100C, the fourth insulating layer 100D, the fifth insulating layer 100E, the sixth insulating layer 100F, and the seventh insulating 100G form the lower level metallization layers.

In various embodiments, the metal lines comprise a conductive material and an outer conductive liner to minimize out-diffusion of the conductive material during subsequent thermal processing. The conductive material comprises copper although in some embodiments may comprise aluminum, tungsten, silver, gold, or other conductive materials. The outer conductive liner comprises a diffusion barrier metal such as titanium nitride, titanium, tantalum, tantalum nitride, tungsten nitride, tungsten carbo nitride (WCN), ruthenium or other suitable conductive nitrides or oxides.

Similarly, the vias comprise a copper core with an outer liner of tantalum nitride and tantalum, although in some embodiments the vias comprise tungsten and outer liners of titanium and titanium nitride or other metal liners or liner combinations.

The metal lines and the vias may be formed in a single step or in separate steps in one or more embodiments. In various embodiments of the invention, the metal and via levels are formed using a single damascene process or a dual damascene process. In a single damascene process, a single layer of insulating material is patterned with a pattern for conductive features, such as conductive lines, conductive vias. In contrast, in a dual damascene process, the vias and metals lines are patterned for conductive features and filled in a single fill step with a conductive material.

Next, the uppermost metallization layer is fabricated in various embodiments as described further below. The metal lines in the uppermost metallization layer act as landing pads for external contacts, for example, to couple to a circuit board. Because of the large number of transistors or device contacted through a few external contacts, the current passing through the uppermost level metal lines is larger than the lower level metal lines. Consequently, the metal lines in the upper most metallization are thicker than the metal lines in the lower metallization levels. Due to complexity of fabricating a thick copper line, uppermost levels of conventional devices are fabricated using aluminum lines.

Figure 2:
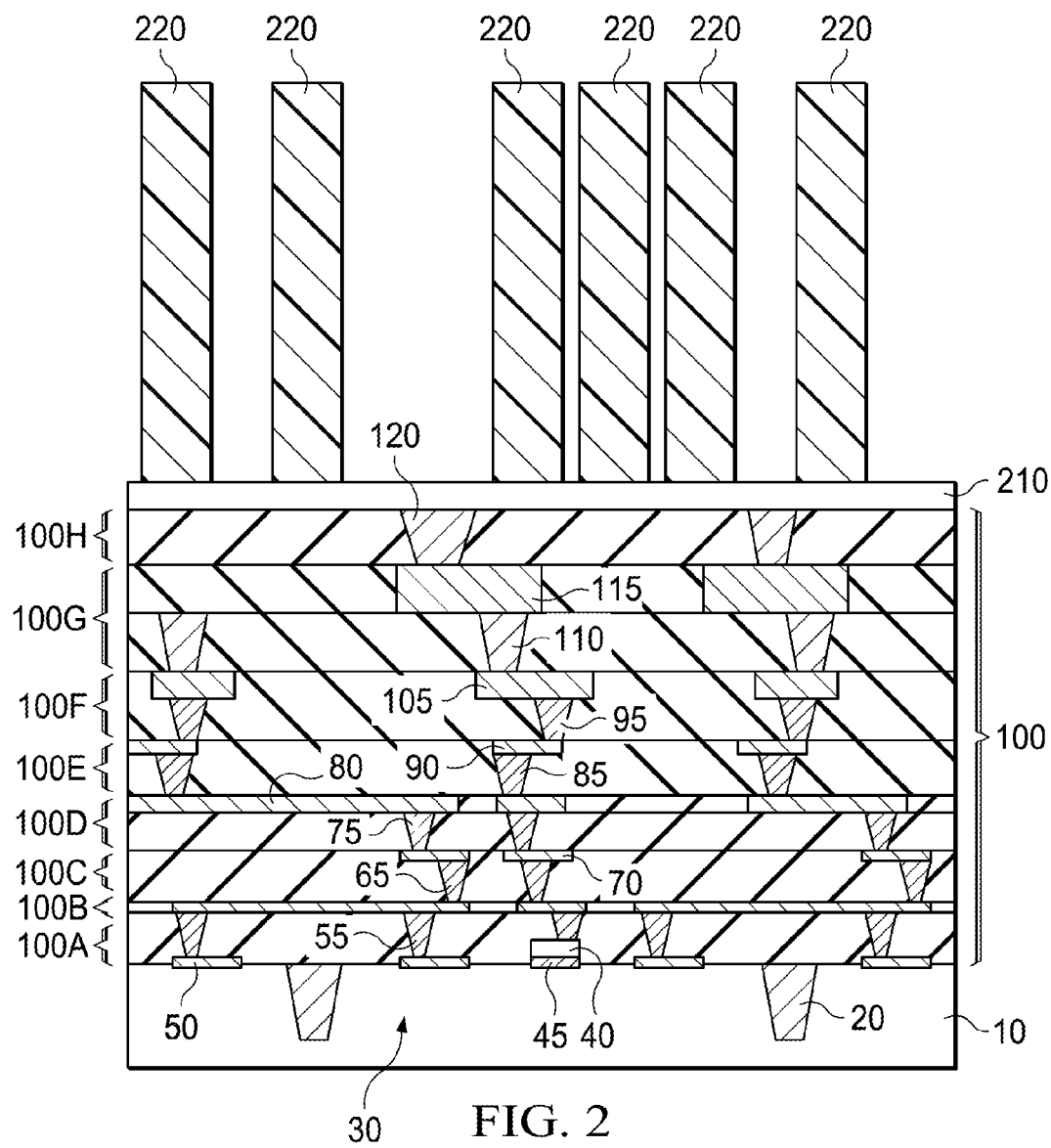
FIG. 2 illustrates the semiconductor device after deposition of a seed layer and after forming a patterned photo resist layer over the last but one metal level in accordance with an embodiment of the invention.

Referring to FIG. 2, a seed layer 210 is deposited over the eighth insulating 100H followed by the formation of a patterned resist. An additional barrier layer (to prevent metal diffusion), for example, comprising titanium nitride or tantalum nitride, may be deposited prior to the deposition of the seed layer 210. The seed layer 210 may be formed by sputter deposition in one embodiment. In other embodiments, other deposition techniques such as chemical vapor deposition may be used to form the seed layer 210. The seed layer 210 comprises a copper layer in one or more embodiments. The seed layer 210 has a thickness of about 20 nm to about 300 nm in various embodiments, and about 50 nm to about 150 nm in one embodiment.

A photo resist layer 220 is formed over the seed layer 210. In one embodiment, the photo resist layer 200 is a negative resist although in other embodiments positive resist may also be used. A negative resist may be used to prevent negatively tapered metal lines and/or avoid forming foot (undercut) in the metal line being formed. The photo resist layer 220 is exposed using a lithographic mask and developed so as to form a patterned resist. The patterned resist exposes some regions of the seed layer 210 for forming metal lines by covering the remaining regions of the seed layer 210. The photo resist layer 220 has a thickness of about 5 μm to about 50 μm in various embodiments, and about 5 μm to about 25 μm in one embodiment.

In various embodiments, after the development of the photo resist layer 220, an additional plasma treatment may be performed to improve the profile of the developed photo resist layer 220. For example, the plasma treatment may remove resist foots, which may be formed after development.

Figure 3:
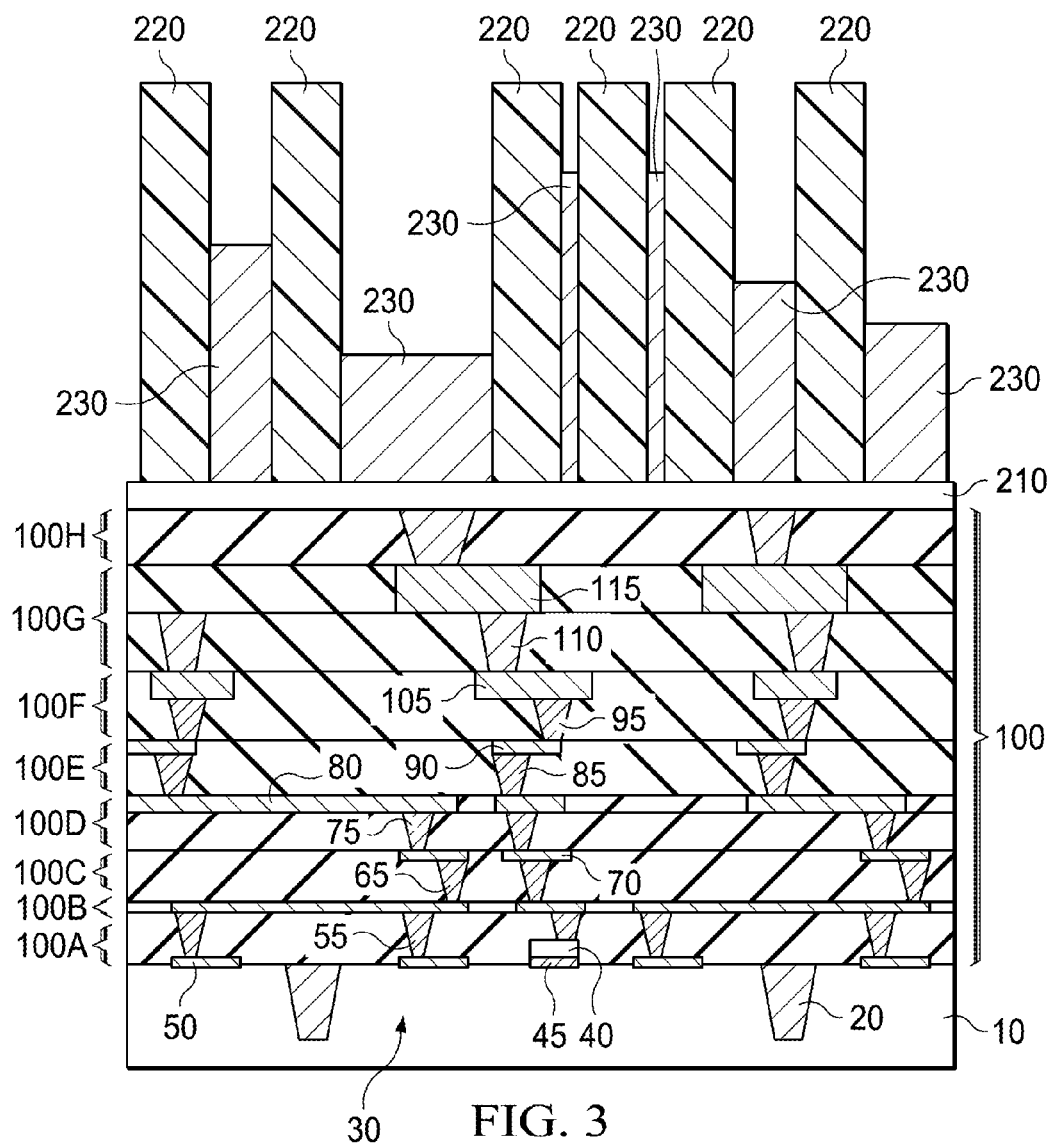
FIG. 3 illustrates the semiconductor device after the electrochemical deposition of copper to form copper lines in accordance with an embodiment of the invention.

As next illustrated in FIG. 3, copper lines 230 are formed over the seed layer 220 between the patterned photo resist layer 220. In various embodiments, the copper lines 230 are formed using an electro-chemical deposition process. Copper lines may be in the form of pure copper, including copper with trace impurities, and copper alloys. Consequently, the copper lines 230 selectively form only over the seed layer 220 and do not form over the photo resist layer 220, which is not conductive. In other words, copper lines 230 are formed only in regions not covered by the patterned photo resist layer 220. Because the deposition rate of copper varies with the size of the aperture, the copper lines 220 have varying thickness after the electro-chemical deposition. In various embodiments, the thickness of the photo resist layer 220 was previously selected to be greater than the thickness of the copper deposited, for example, in the narrowest aperture. This is needed to avoid short between various copper lines. The thickness of the copper after the electro-chemical deposition is about 2 μm to about 15 μm in one or more embodiments, and about 5 μm in one embodiment. The thickness of the copper after the electro-chemical deposition is about 10 μm to about 15 μm while the photo resist layer 220 has a thickness of about 15 μm to about 25 μm in one embodiment.

In one or more embodiments, the surface of the copper lines 230 is significant compared to the total surface area of the substrate 10. In one or more embodiments, the total surface of the copper lines 230 is at least 20% of the area of the substrate 10, and at least about 50% in one embodiment. In one or more embodiments, the total surface of the copper lines 230 is about 20% to about 80% of the area of the substrate 10, and about 50% to about 70% in one embodiment. This is done to accommodate the large sized contact structures such as landing pads etc.

Figure 4:
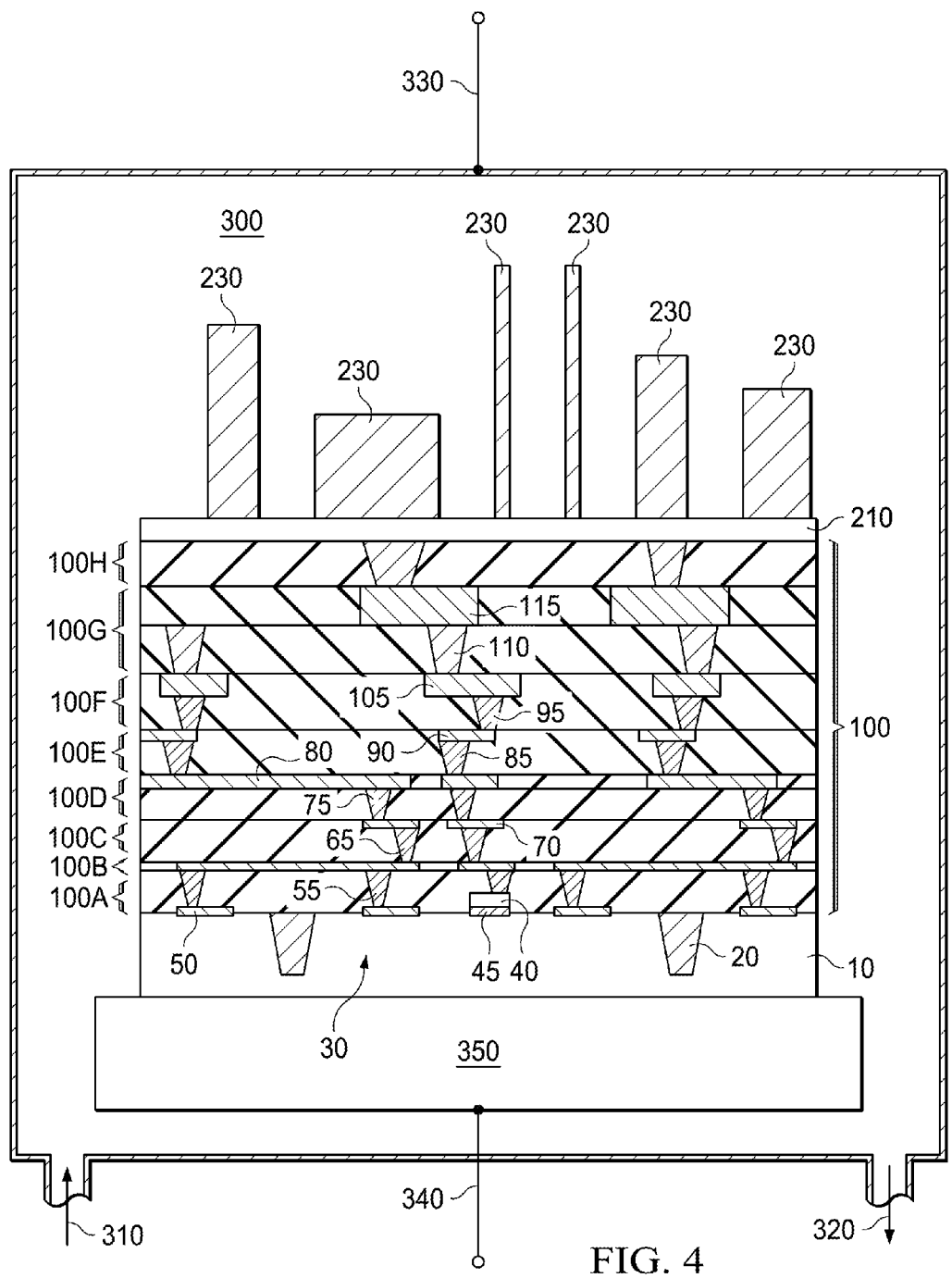
FIG. 4 illustrates the semiconductor device after the stripping of the photo resist layer in accordance with an embodiment of the invention.

FIG. 4 illustrates the semiconductor structure after stripping of the photo resist layer 220 in a plasma chamber 150. The semiconductor structure is placed within the plasma chamber 150 of a plasma tool. This may be a single wafer tool or a chamber of cluster tool in various embodiments. Gas inlets 310 and outlet 320 provide a continuous supply of gases into the plasma chamber 150 while the plasma node 330 generates a plasma within the plasma chamber 150. Although illustrated herein that the plasma is generated in the same chamber in which the substrate 10 is treated, embodiments of the invention also include remote plasma processes. In a remote plasma process, the plasma may be generated in a different chamber from the etching chamber. Thus, after generating the plasma in a remote chamber, the plasma may be passed through an inlet tube into the etching chamber where the substrate 10 is exposed to the plasma. The substrate 10 is placed over a carrier 350, which may be coupled a substrate node 340 in some embodiments.

The photo resist layer 220 has to be removed but without damaging the copper lines 230 and the seed layer 210. The top surface of the copper lines 230 is continuously exposed to the etching chemicals. Unlike, the fabrication of the lower level metallization layers, the exposure to the etching is prolonged due to the large thickness of the photo resist layer 220 in the uppermost metallization layer. Consequently, conventional etching processes may remove or damage copper in the copper lines 230. Further, in such processes, some of the oxidized photo resist may be re-deposited over the copper lines 230 as residue, which may be hard to remove even later. As described above, the top surface area of the copper lines 230 is a significant fraction of the total surface area of the substrate unlike lower level metallization. Unlike dielectric materials such as silicon dioxide or even low-k inter level dielectric layers, copper has a strong affinity towards oxygen. The large copper area behaves like a getter for oxygen radicals in the plasma dramatically changing the conditions within the plasma chamber as well as forming copper oxide layers (film) and/or particles over the copper lines 230.

As a consequence, the copper in the copper lines 230 and the seed layer 210 is oxidized if a conventional plasma etch process is used. Copper oxidation can be reduced if a lower etching temperature (for example, the chuck or wafer temperature) is used. However, reducing temperature also increases the time needed to etch the photo resist layer 220 because both the oxidation rate of copper and etch rate of the photo resist layer reduce with a decrease in temperature. The increased etching time dramatically reduces the process throughput (e.g., number of wafers processed per unit time). For example, the process may take more than 10 hrs to etch 25 μm of the photo resist material at room temperature. Alternatively, the throughput can be increased by increasing temperature but this increases the oxidation rate of copper damaging the copper lines 230 and the underlying seed layer 210.

Embodiments of the invention overcome these limitations by modifying the oxidation rate of copper without significantly affecting the etch rate of the photo resist layer. In various embodiments, the plasma chemistry is modified to include an oxidizing species to etch the photo resist layer 220 and a reducing species to protect the copper lines 230 and the seed layer 210. In various embodiments, the reducing species reduces the oxidizing effect of copper in the copper lines 230 without significantly impacting the etch rate of the photo resist layer.

In one or more embodiments, the plasma chemistry comprises oxygen and water vapor. The oxygen radicals oxidize the photo resist layer as well as the copper in the copper lines 230 and the seed layer 210. The water vapor may form hydroxyl radicals, which is a reducing agent, and therefore reduces the oxidation rate. Similarly, neutral hydrogen such as atomic hydrogen or molecular hydrogen can be added as a reducing agent in other embodiments. Advantageously, water vapor is more efficient than other sources of hydrogen such as neutral or positively charged monoatomic hydrogen. Further, embodiments of the invention may include other reducing agents such as carbon monoxide.

In various embodiments, the temperature of the plasma is about 150° C. to about 300° C., and about 180° C. to about 280° C. in one embodiment. In one embodiment, a temperature of at least 180° C. is used to avoid very low strip rates. Further, the plasma is generated from nitrogen flowing at about 300 sccm to about 800 sccm, oxygen flowing at about 500 sccm to about 1500 sccm, water vapor flowing at 2000 sccm to about 3000 sccm, at a pressure of about 300 mTorr to about 1000 mTorr, and with a microwave power of 2000 W to about 3000 W. The etch time is about 100 s to about 800 s to etch about 25 μm of the photo resist layer 220. In one embodiment, the plasma temperature is about 200° C. to about 250° C. In such an embodiment, the plasma is generated from nitrogen flowing at about 500 sccm, oxygen flowing at about 1000 sccm, water vapor flowing at about 2500 sccm, at a pressure of about 500 mTorr, with a microwave power of about 2500 W.

In various embodiments, at about 600 mT pressure and about 2500 W of microwave power, the ratio of water to oxygen is about 1:3 to about 5:1, and about 3:1 at about 200° C. to about 250° C. in one embodiment. In various embodiments, the amount of nitrogen may be varied without any substantial effect besides diluting the oxygen and water vapor due to change in the total pressure.

Figure 5:
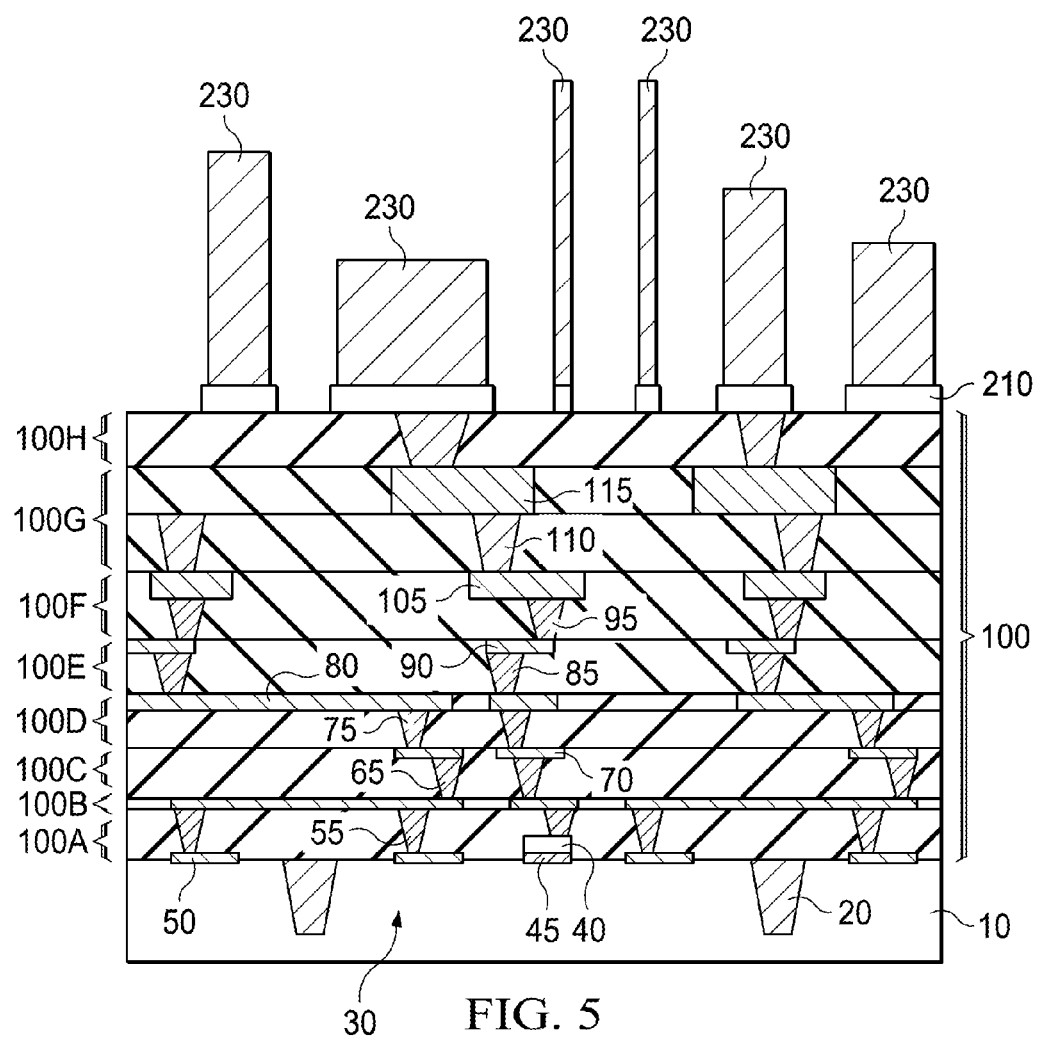
FIG. 5 illustrates the semiconductor device after etching portions of the seed layer, which are not covered with copper lines in accordance with an embodiment of the invention.

FIG. 5 illustrates the semiconductor device after etching the seed layer 220. The underlying seed layer 220, which has been exposed due to the removal of the photo resist layer is exposed to an etching process. For example, the seed layer 220 may be etched using a wet etch process that removes copper from all areas in one embodiment. Advantageously, the etching process also removes other forms of copper such as compounds and alloys. For example, any copper oxide may also be removed during the etching process. The removal of the seed layer 220 removes any shorts between the adjacent copper lines 230. Advantageously, using the embodiments of the invention, the copper lines 230 do not have any residue or oxide protecting the copper and can therefore be easily etched.

Figure 6:
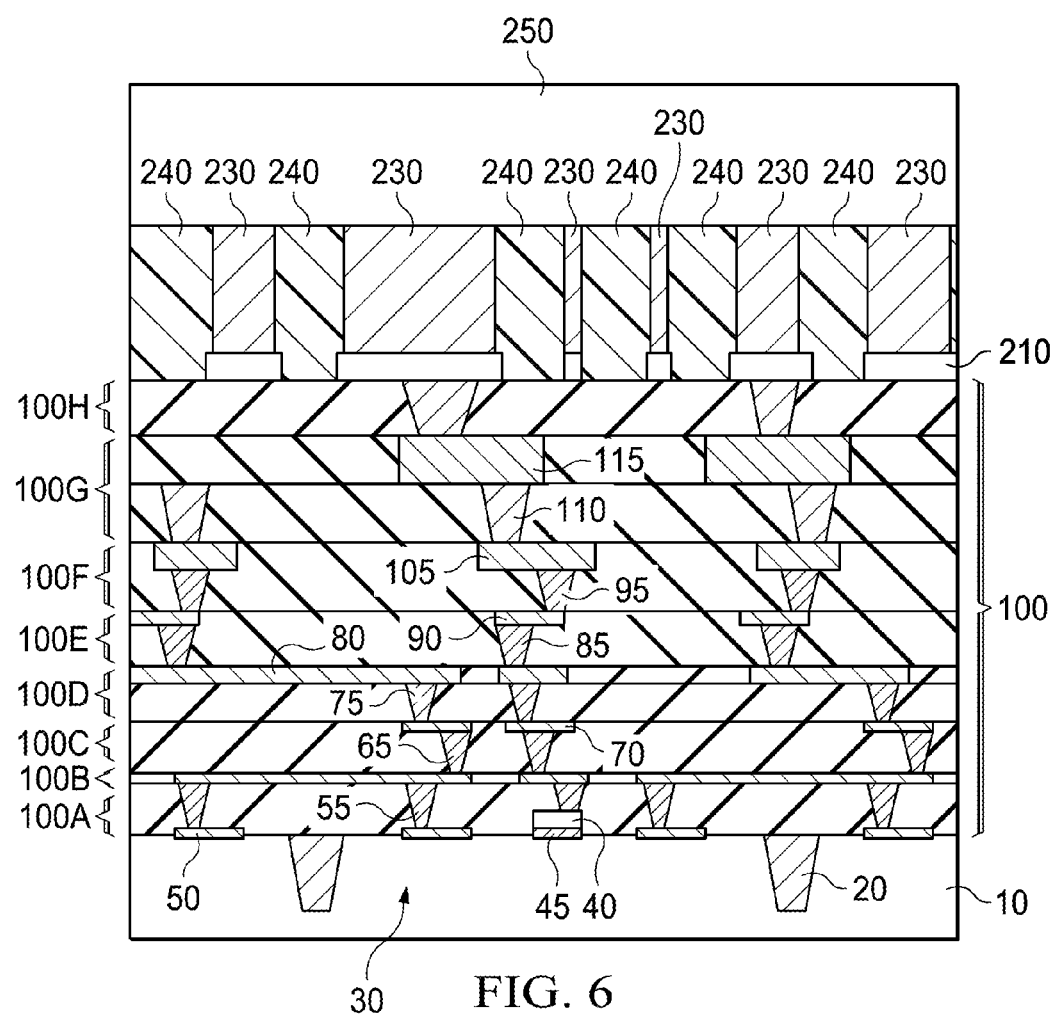
FIG. 6 illustrates the semiconductor device after the formation of a protective passivation layer in accordance with an embodiment of the invention.

Referring next to FIG. 6, if needed, the adjacent spaces between the copper lines 230 are filled with a dielectric material 240. A planarization or polishing process, such a chemical mechanical planarization, may be performed and the copper lines 230 may be ground down to ensure that all the copper lines 230 have similar thicknesses. A passivation layer 250 may be formed over the dielectric material 240. Further processing may proceed as in conventional semiconductor manufacturing. For example, contacts to the copper lines 230 may be formed.

Figure 7:
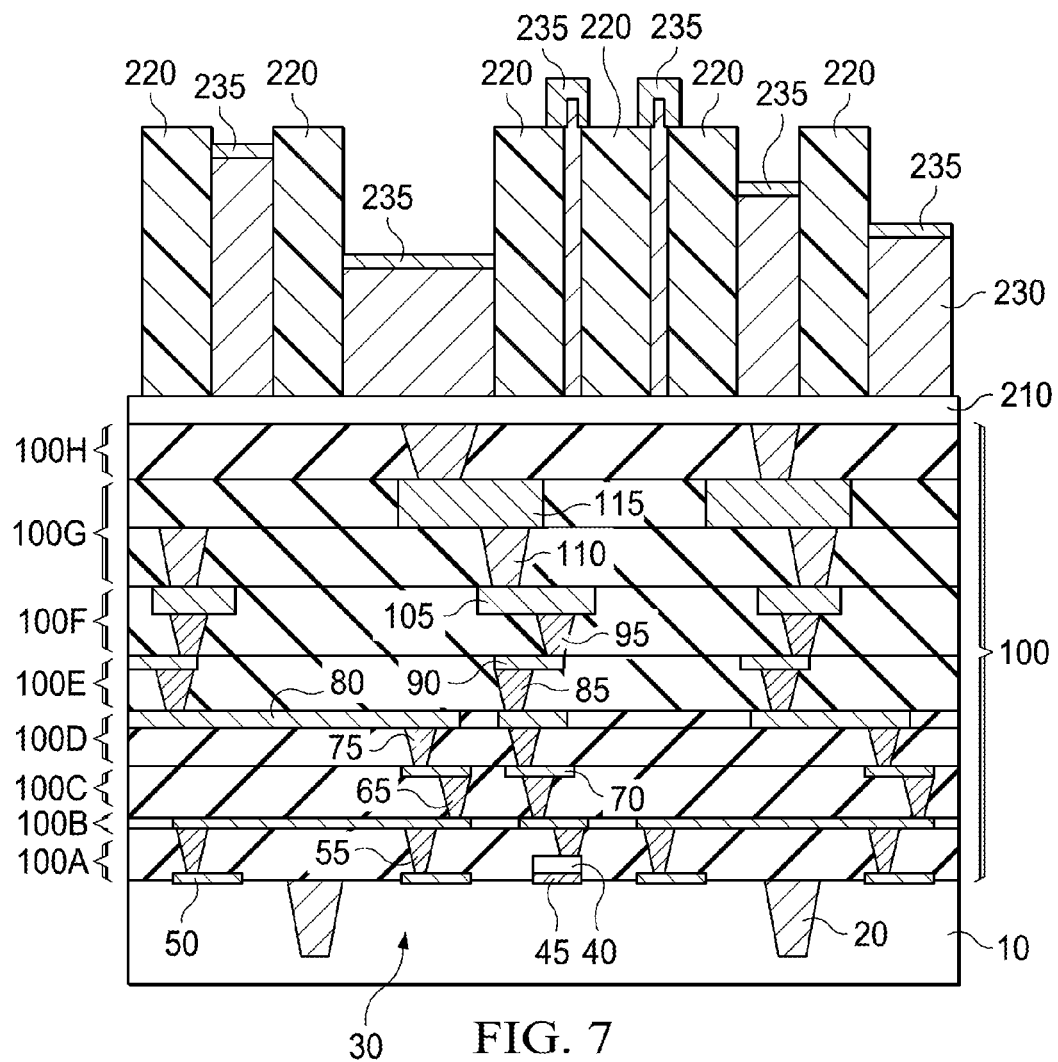
FIG. 7 illustrates the semiconductor device after etching a portion of the photo resist layer showing the formation of a copper oxide layer in accordance with an alternative embodiment of the invention.
Figure 8:
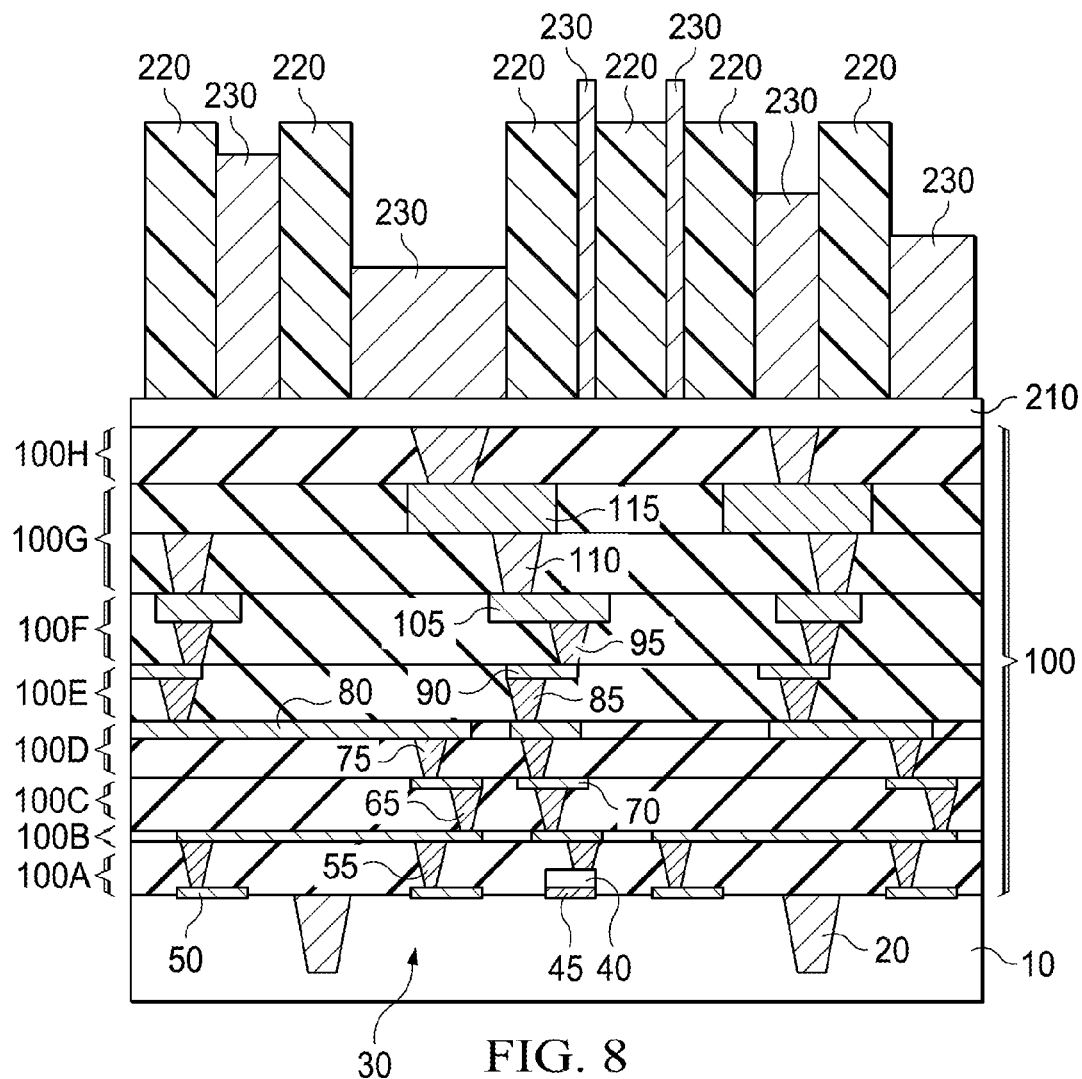
FIG. 8 illustrates the semiconductor device after a reducing plasma etch, which removes any copper oxide formed previously in accordance with the alternative embodiment of the invention.

FIG. 7-8 illustrate an alternative embodiment of the invention of forming copper lines in the last or uppermost metal level of a semiconductor device.

This embodiment proceeds as in the previous embodiment with regard to FIGS. 1-3. Accordingly, as illustrated in FIG. 3, a seed layer 210, a patterned photo resist layer 220, and copper lines 230 are formed. The substrate 10 is placed within a plasma chamber for etching the photo resist layer 220 (e.g., as described previously). However, in this embodiment, the processing within the plasma chamber is different from the prior embodiment.

FIG. 7 illustrates the semiconductor device during the plasma etching process. In this embodiment, the etching is conducted in at least three steps or phases. As illustrated in FIG. 7, a portion of the photo resist layer 220 has been removed as described previously using a oxidizing and reducing plasma chemistry. Nevertheless, some portion of the copper may still be oxidized. Therefore, in this embodiment, after some copper oxide 235 is formed, the plasma chemistry is changed to be a reducing chemistry.

Hence, in a first stage of processing, the plasma chemistry may be similar to that described earlier with FIGS. 3-4. The first stage may include oxidizing and reducing components in the plasma. Next, the second stage of the plasma process is performed, which is a reducing plasma. In one embodiment, during the reducing plasma phase, the flow of the oxidizing species may be reduced relative to the reducing species. Therefore, any copper oxide formed over the copper lines 230 is removed, i.e., converted back to copper. In one embodiment, the flow of oxygen may be reduced or completely cut off in another embodiment. For example, the ratio of the flow rate of the oxygen to the flow rate of water vapor is about 1:2 to about 1:10 during the first stage but increases to about 1:10 to about 1:100 during the second stage.

In some embodiments, a third component may be introduced during this second phase of etching. For example, hydrogen may be added to increase the reducing effect of the plasma. The increase in reducing species increasing the reducing effect of the plasma. Therefore, any copper oxide 235 formed previously is converted to copper. The copper lines 230 after the completion of the second phase are illustrated in FIG. 8.

Next, in a third stage, the plasma chemistry is changed to increase the oxidizing species. For example, the plasma chemistry is now the same as the plasma chemistry used in the first phase of the plasma etching. Consequently, after the end of the third phase of the etching, the semiconductor device being fabricated has no photo resist layer 220 as illustrated in FIG. 4. Advantageously, all the stages of the plasma process are performed within the same plasma chamber thereby avoiding contamination issues. However, in one alternative embodiment, the second stage of etching may be performed outside the plasma chamber, which provides the flexibility of using other types of etching. For example, the second stage of etching may be performed using a wet etching process that selectively removes copper oxide. In one embodiment, all three phases are performed in different chambers but within the same cluster tool. This avoids the need to remove the substrate 10 from the etch tool and therefore avoids contamination issues while providing the ability to use different type of etching process in the different stages, e.g., plasma etching in the first stage and wet etching in the second stage. Further processing continued as described above with respect to FIGS. 4-6.

FIG. 9, which includes FIGS. 9A-9F, illustrates the plasma etch chemistry for stripping photo resist layers without damaging copper lines in accordance with embodiments of the invention.

Figure 9B:
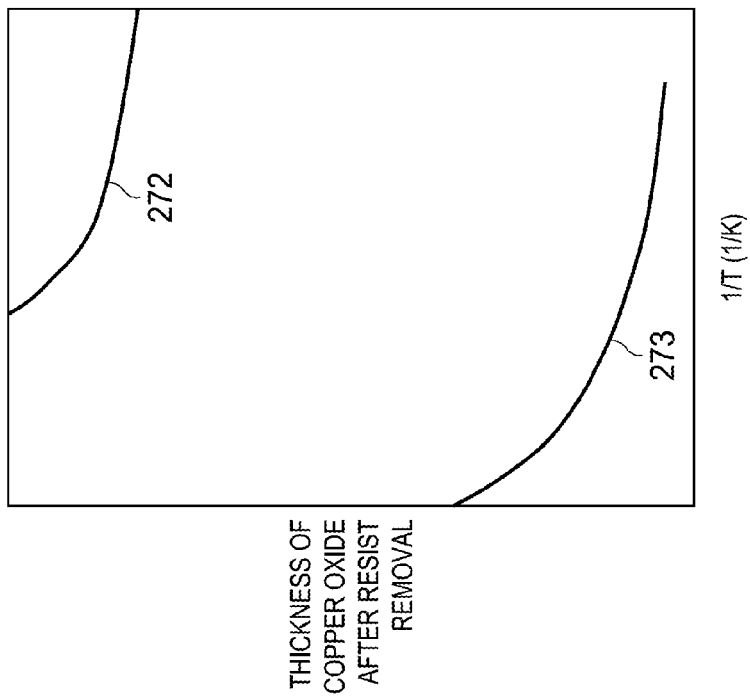
Figure 9A:
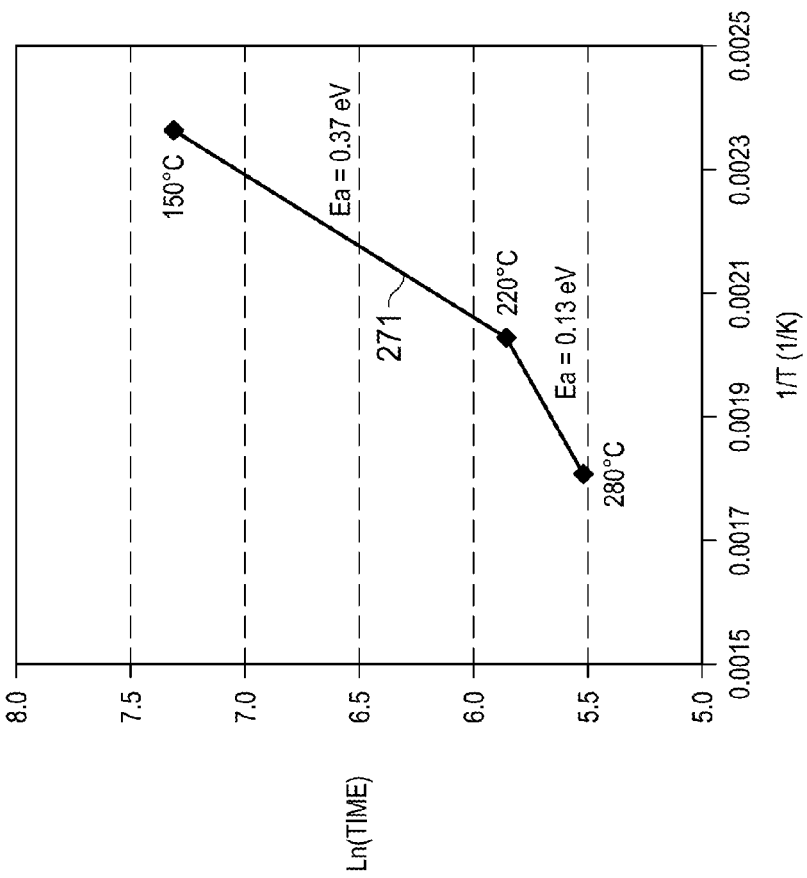

Referring to FIG. 9A, illustrates the time (curve 271) to remove a given thickness of the photo resist layer (e.g. the photo resist layer 220 in FIG. 3) in accordance with an embodiment of the invention. As illustrated, at a temperature of about 150° C., this time is about 1500 s, while at the temperature of about 220° C., this time reduces to about 350 s. Thus a total activation of the process is about 0.37 eV in the temperature range 150° C. to 220° C. However, upon further increasing the plasma temperature to about 280° C., this time reduces to about 250 s. Therefore, an increase in temperature from 220° C. to about 280° C. does not reduce the time as expected. For example, this is indicated by the activation energy of the process of about 0.13 eV in the temperature range 220° C. to 280° C. Thus, the mechanism of the plasma chemistry is changing with a change in temperature. For example, this may be because of the different activation energies of the hydrogen and the hydroxyl radicals in the water vapor.

In contrast as shown by FIG. 9B, the rate of copper oxidation continues to increase with an increase in temperature. FIG. 9B shows the thickness of copper oxide (curves 272 and 273) formed over the copper lines after the completion of the plasma process (e.g., over the copper lines 230 in FIG. 4). Curve 272 shows the thickness of copper oxide after using a oxygen plasma while curve 273 illustrates the thickness of the copper oxide after using an oxygen/water vapor plasma in accordance with an embodiment of the invention. As illustrated, the addition of the water vapor into the plasma reduces the oxidation rate of copper dramatically.

Figure 9D:
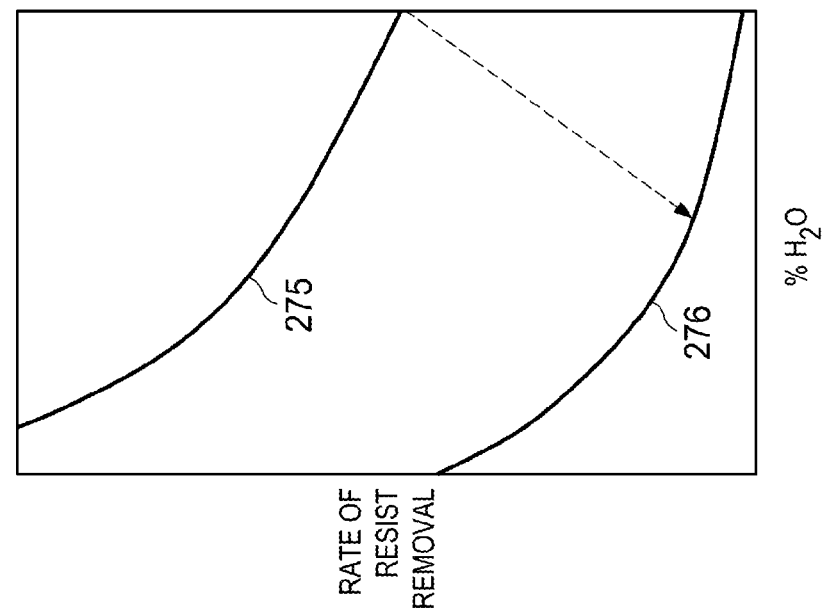
Figure 9C:
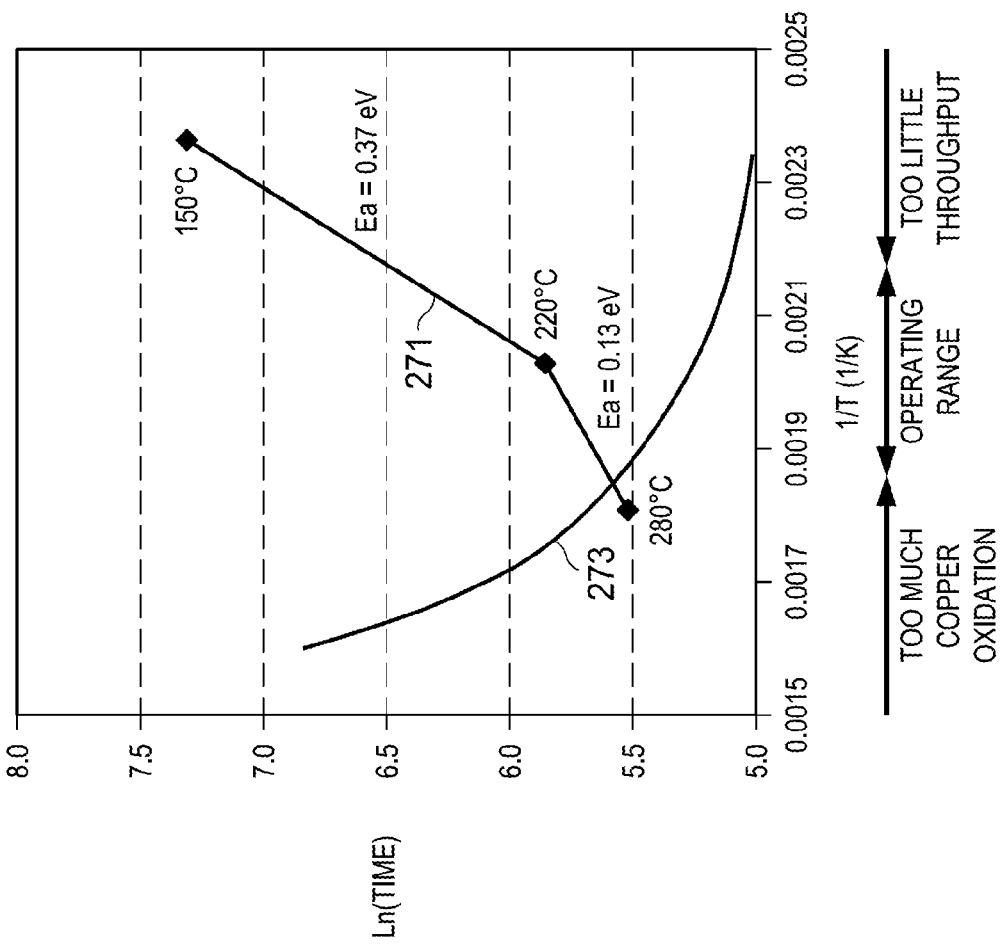

FIG. 9C illustrates the rate of copper oxidation superimposed on the time to remove the photo resist layer. Increasing the temperature beyond a certain point increases the risk of copper oxidation without a significant improvement in throughput. Rather, the gain in throughput is not sufficient to justify the loss of process yield for example, at about 280° C. and beyond. This is illustrated by the arrows, which show the process window (operating regime), the zone of low throughput on the right, and the zone of high process risk on the left side.

FIG. 9D illustrates the rate of resist removal (strip rate) with varying water vapor content with varying temperature. As illustrated, the rate of resist removal (curve 276) follows a parabola. Similarly, at lower temperatures (curve 275), increasing the water vapor fraction continuously reduces the rate of resist removal. The behavior of the time to etch curve with increasing temperature is illustrated by the dashed arrow.

However, the inventors have found that the beneficial effects of the reducing agent result in the above relationship shown in FIG. 9D. FIG. 9E illustrates the variation of the strip rate (rate of removal of resist) during the etching process. The strip rate increases with increasing temperature. But as illustrated in FIG. 9E, a first curve 277 shows the change in strip rate for an oxygen rich chemistry. The initial rate of removal of the resist is proportional to the oxygen concentration. Therefore, initially the resist is removed is a faster pace than a water vapor rich chemistry shown by the second curve 278. However, as the volume of resist decreases due to etching, the relative volume of exposed copper to the remaining resist increases dramatically. For example, at the beginning of the etching, the surface area of exposed copper to the surface area of the resist may be about 1:1, which may increase to 1:100 due to reduction in the volume of the resist. At this stage of the etching, the exposed copper oxidizes faster. Consequently, the etchant may be consumed primarily by the oxidizing copper thereby diluting the amount of etchant that reaches the resist. Further, the oxidized copper may behave as a passivation layer blocking the etchant from reaching the remaining resist. Consequently, the strip rate of the resist dramatically falls during the etching in an oxygen rich chemistry. In contrast, in the water vapor rich chemistry as shown in the second curve 278, the copper is protected from oxidation and therefore the strip rate does not change much during the etching.

FIG. 9F illustrates the maximum temperature of resist removal (as identified from the higher end of the operating range in FIG. 9C) superimposed on the same graph as the time to etch the photo resist layer with varying water vapor content. For example, the maximum temperature of etching may be the temperature at which no significant copper oxide/residue is produced. As illustrated in FIG. 9F, the maximum temperature of resist removal (curve 279) follows a parabolic with diminishing returns at higher water vapor content. Further, as described above in FIG. 9D, the rate of resist removal (curve 276) decreases with increasing water vapor content. This is because of the changes in the plasma chemistry with water vapor content and temperature. Therefore, the best operating range is a process window 280. Lower (left of the process window) results in increased time to etch coupled with lower temperatures while right of the process window results in higher temperature and longer etch times. In other words, the inventors have found that the etching times increases both to the left and right of the process window. However, as described previously, this result is obtained because of very different competing processes arising from copper oxidation and passivation at high oxygen concentration and low strip rates at high water vapor concentration.

In various embodiments, the process window 280 has a temperature window of about 150° C. to about 300° C., and about 180° C. to about 280° C. in one embodiment. In various embodiments, the minimum temperature is about 180° C. while the maximum temperature if about 280° C. In various embodiments, the ratio of water to oxygen ranges from about 1:2 to about 10:1. In one embodiment, the minimum amount of water to oxygen ratio is about 1:2 to about 1:5. In one or more embodiments, the maximum amount of water to oxygen ratio is about 3:1 to about 10:1.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While the present invention has been described using copper, embodiments of the invention may also be applied towards other metals. In particular, embodiments of the invention may be applied to metals that may be electroplated and are susceptible to oxidation (lose electrons) or corrosion. Examples of such metals include transition metals such as nickel, silver, gold, platinum, and others.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIG. 1-6 may be combined with the embodiments described in FIG. 7-8. Embodiments of the invention described with respect to FIG. 9 may be applied to either the embodiments described in FIGS. 1-6 or FIGS. 7-8. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof, for example, of a plasma tool. As another example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    forming a seed layer disposed over a substrate having a top surface;
    forming a patterned resist layer over the seed layer;
    forming metal lines on regions of the seed layer not covered by the patterned resist layer; and
    removing the patterned resist layer using a plasma process comprising an oxidizing species and a reducing species, wherein the reducing species is configured to prevent oxidation of the metal lines and the seed layer during the plasma process.

2. The method of claim 1, wherein the metal lines comprises the element copper.

3. The method of claim 2, wherein the element copper is in the form of a copper alloy or a pure copper.

4. The method of claim 3, wherein the metal lines comprise a top surface, and wherein a total surface area of the top surface of the metal lines is at least 50% of the surface area of the top surface of the substrate.

5. The method of claim 1, wherein the metal lines comprise an element selected from the group consisting of nickel, gold, silver, and platinum.

6. The method of claim 1, wherein the metal lines are formed by an electro-chemical deposition process.

7. The method of claim 1, further comprising forming a barrier layer between the seed layer and an underlying dielectric layer.

8. The method of claim 1, wherein a thickness of the metal lines is about 2 μm to about 15 μm, and wherein a thickness of the patterned resist layer is about 5 μm to about 25 μm.

9. The method of claim 1, wherein the oxidizing species comprises oxygen, and wherein the reducing species comprises hydrogen.

10. The method of claim 1, wherein a plasma chemistry for the plasma process comprises nitrogen flowing at about 300 sccm to about 800 sccm, oxygen flowing at about 500 sccm to about 1500 sccm, water vapor flowing at 2000 sccm to about 3000 sccm, wherein a pressure in a plasma chamber is about 300 mTorr to about 1000 mTorr, wherein a temperature of the plasma chamber is about 200° C. to about 300° C., and wherein the plasma is generated with a microwave power of 2000 W to about 3000 W.

11. The method of claim 1, wherein exposed surfaces of the metal lines have substantially no metal oxide after removing the patterned resist layer.

12. The method of claim 1, wherein a thickness of a metal oxide layer over the metal lines is between 0.1 nm to about 20 nm after removing the patterned resist layer.

13. The method of claim 1, wherein forming metal lines comprises forming landing pads.

14. A method of forming a semiconductor device, the method comprising:
 forming a seed layer disposed over a substrate having a top surface;
 forming a patterned resist layer over the seed layer;
 forming metal lines on regions of the seed layer not covered by the patterned resist layer; and
 removing the patterned resist layer using a plasma process comprising an oxidizing species and a reducing species, wherein a thickness of the metal lines is at least 2 µm, and wherein a thickness of the patterned resist layer is at least 5 µm.

15. A method of forming a semiconductor device, the method comprising:
 forming a seed layer disposed over a substrate having a top surface;
 forming a patterned resist layer over the seed layer;
 forming metal lines on regions of the seed layer not covered by the patterned resist layer; and
 removing the patterned resist layer using a plasma process comprising an oxidizing species and a reducing species, wherein the metal lines comprise a top surface, and wherein a total surface area of the top surface of the metal lines is at least 50% of the surface area of the top surface of the substrate.

16. A method of forming a semiconductor device, the method comprising:
 forming a seed layer over a substrate;
 forming a patterned resist layer over the seed layer;
 forming metal lines between the patterned resist layer; and
 removing a first portion of the patterned resist layer using a plasma process in a first stage of the plasma process, wherein a first plasma chemistry of the plasma process during the first stage comprising an oxidizing species and a reducing species,
 during a second stage of the plasma process removing metal oxide particles formed over the metal lines in the first stage, wherein a second plasma chemistry of the plasma process during the second stage is more reducing than the first plasma chemistry; and
 removing a second portion of the patterned resist layer using the plasma process in a third stage of the plasma process, wherein a third plasma chemistry of the plasma process during the third stage comprising the oxidizing species and the reducing species.

17. The method of claim 16, wherein the metal lines and the seed layer comprise the element copper.

18. The method of claim 17, wherein the element copper is in the form of a copper alloy or a pure copper.

19. The method of claim 16, wherein forming a patterned resist layer comprises:
 depositing a blanket resist layer;
 exposing the blanket resist layer through a lithographic process;
 developing the blanket resist layer; and
 treating the developed blanket resist layer to form the patterned resist layer.

20. The method of claim 16, further comprising forming a barrier layer between the seed layer and an underlying dielectric layer.

21. The method of claim 16, wherein the second plasma chemistry is more reducing than the third plasma chemistry.

22. The method of claim 16, wherein removing metal oxide particles formed over the metal lines comprises reducing a flow rate of the oxidizing species.

23. The method of claim 16, wherein removing metal oxide particles formed over the metal lines comprises introducing a second reducing species.

24. The method of claim 16, wherein a flow rate of the oxidizing species in the first stage is the same as a flow rate of the oxidizing species in the third stage.

25. The method of claim 16, wherein the oxidizing species comprises oxygen, and wherein the reducing species comprises water vapor.

26. The method of claim 25, wherein a ratio of a flow rate of the oxygen to a flow rate of water vapor is about 1:2 to about 1:10 during the first stage.

27. The method of claim 26, wherein a ratio of a flow rate of the oxygen to a flow rate of water vapor is about 1:10 to about 1:100 during the second stage.

28. The method of claim 16, wherein the oxidizing species comprises oxygen, and wherein the reducing species comprises hydrogen.

29. The method of claim 16, wherein the plasma chemistry for the plasma process comprises nitrogen flowing at about 300 sccm to about 800 sccm, oxygen flowing at about 500 sccm to about 1500 sccm, water vapor flowing at 2000 sccm to about 3000 sccm, wherein a pressure in a plasma chamber is about 300 mTorr to about 1000 mTorr, wherein a temperature of the plasma chamber is about 200° C. to about 300° C., and wherein the plasma is generated with a microwave power of 2000 W to about 3000 W.

30. The method of claim 16, wherein removing a second portion of the patterned resist layer removes all the patterned resist layer, and wherein exposed surfaces of the metal lines have substantially no metal oxide after removing a second portion of the patterned resist layer.

31. A method of forming a semiconductor device, the method comprising:
 forming all metallization layers except the uppermost metallization layer over a substrate comprising device regions;
 forming a metal seed layer after forming all of the metallization layers except the uppermost metallization layer;
 forming a patterned resist layer over the metal seed layer;
 using an electro-chemical deposition process, forming metal lines between the patterned resist layer, wherein the metal lines are part of the uppermost metallization layer; and
 etching the patterned resist layer using a plasma process comprising oxygen and water vapor, wherein the water vapor prevents oxidation of the metal lines and the metal seed layer by the oxygen during the plasma process, wherein a thickness of the metal lines is at least 2 µm, wherein a thickness of the patterned resist layer is at least 5 µm, wherein the metal lines comprise a top surface, and wherein a total surface area of the top surface of the metal lines is at least 50% of the surface area of the top surface of the substrate.

32. The method of claim 31, wherein the metal lines and the metal seed layer comprise the element copper.

33. The method of claim 32, wherein the element copper is in the form of a copper alloy or a pure copper.

34. The method of claim 31, wherein a thickness of the metal lines is about 2 µm to about 15 µm, and wherein a thickness of the patterned resist layer is about 5 µm to about 25 µm.

35. The method of claim 31, wherein the total surface area of the top surface of the metal lines is about 35% to about 90% of the surface area of the top surface of the substrate.

36. The method of claim 31, wherein the flow rate of the water vapor into a plasma chamber in which the etching is being performed is at least two times a flow rate of the oxygen into the plasma chamber.

37. The method of claim 31, further comprising:
reducing the flow rate of the oxygen from initial flow rate during the plasma etching;
maintaining the flow rate of the oxygen at the reduced flow rate; and
increasing the flow rate of the oxygen to the initial flow rate.

38. The method of claim 37, further comprising removing metal oxide film formed over the metal lines when maintaining the flow rate of the oxygen.

39. A method of forming a semiconductor device, the method comprising:
forming a seed layer disposed over a substrate having a top surface;
forming a patterned resist layer over the seed layer;
forming metal lines on regions of the seed layer not covered by the patterned resist layer; and
removing the patterned resist layer without substantially forming an oxide layer by using a plasma process comprising a reducing species configured to prevent oxidation of the metal lines.

40. The method of claim 39, wherein the patterned resist layer is removed during a plasma process.

41. The method of claim 39, wherein the plasma process comprises an oxidizing species and a reducing species.

42. A method of forming a semiconductor device, the method comprising:
forming a seed layer disposed over a substrate having a top surface;
forming a patterned resist layer over the seed layer;
forming metal lines on regions of the seed layer not covered by the patterned resist layer; and
removing the patterned resist layer using a plasma process comprising an oxidizing species and a reducing species, wherein the oxidizing species comprises oxygen, and wherein the reducing species comprises water vapor or carbon monoxide.

43. The method of claim 42, wherein the oxidizing species comprises oxygen, and wherein the reducing species comprises water vapor.

44. The method of claim 43, wherein a ratio of a flow rate of the oxygen to a flow rate of water vapor is about 1:2 to about 1:10.

45. The method of claim 42, wherein the oxidizing species comprises oxygen, and wherein the reducing species comprises carbon monoxide.

* * * * *